United States Patent
Pawlak

(10) Patent No.: US 7,582,547 B2
(45) Date of Patent: Sep. 1, 2009

(54) METHOD FOR JUNCTION FORMATION IN A SEMICONDUCTOR DEVICE AND THE SEMICONDUCTOR DEVICE MADE THEREOF

(75) Inventor: Bartlomiej Jan Pawlak, Leuven (BE)

(73) Assignees: Interuniversitair Microelektronica Centrum vzw (IMEC), Leuven (BG); Koninklijke Philips Electronics, Eindhoven (NL)

( * ) Notice: Subject to any disclaimer, the term of this patent is extended or adjusted under 35 U.S.C. 154(b) by 206 days.

(21) Appl. No.: 11/833,931

(22) Filed: Aug. 3, 2007

(65) Prior Publication Data

US 2008/0057683 A1 Mar. 6, 2008

Related U.S. Application Data

(60) Provisional application No. 60/835,719, filed on Aug. 4, 2006.

(30) Foreign Application Priority Data

Dec. 8, 2006 (EP) .................................. 06025413

(51) Int. Cl.
*H01L 21/4763* (2006.01)
(52) U.S. Cl. ...................... 438/528; 438/479; 438/482; 438/510; 438/525; 257/E21.133; 257/E21.409; 257/E21.473; 257/E29.266; 257/E31.001
(58) Field of Classification Search ................ 438/479, 438/482, 510, 525, 528; 257/E21.11, 409, 257/473, E29.003, E31.001, 265
See application file for complete search history.

(56) References Cited

U.S. PATENT DOCUMENTS

| | | | |
|---|---|---|---|
| 4,904,611 A * | 2/1990 | Chiang et al. | 438/479 |
| 6,037,640 A | 3/2000 | Lee | |
| 6,225,176 B1 * | 5/2001 | Yu | 438/305 |
| 6,680,250 B1 | 1/2004 | Paton et al. | |
| 6,767,831 B1 | 7/2004 | Chu et al. | |
| 6,936,505 B2 * | 8/2005 | Keys et al. | 438/166 |

(Continued)

FOREIGN PATENT DOCUMENTS

EP  0 717 435 A1  6/1996

(Continued)

OTHER PUBLICATIONS

Moroz, et al., Optimizing boron junctions through point defect and stress engineering using carbon and germanium co-implants; Applied Physics Letters 87, 051908 (2005); 2005 American Institute of Physics; published online Jul. 26, 2005.

(Continued)

*Primary Examiner*—Michael S Lebentritt
(74) *Attorney, Agent, or Firm*—Knobbe Martens Olson & Bear LLP

(57) ABSTRACT

Devices and methods for junction formation in manufacturing a semiconductor device are disclosed. The devices have shallow junction depths far removed from end-of range defects. The method comprises forming an amorphous region in a crystalline semiconductor such as silicon down to a first depth, followed by implantation of a substitutional element such as carbon to a smaller depth than the first depth. The region is then doped with suitable dopants, e.g. phosphorus or boron, and the amorphous layer recrystallized by a thermal process.

25 Claims, 13 Drawing Sheets

U.S. PATENT DOCUMENTS

| | | | |
|---|---|---|---|
| 7,482,255 B2 * | 1/2009 | Graoui et al. | 438/528 |
| 2003/0111699 A1 | 6/2003 | Wasshuber et al. | |
| 2004/0235280 A1 | 11/2004 | Keys et al. | |
| 2006/0006427 A1 | 1/2006 | Tan et al. | |
| 2008/0149929 A1 * | 6/2008 | Giles | 257/57 |
| 2009/0085035 A1 * | 4/2009 | Giles | 257/60 |

FOREIGN PATENT DOCUMENTS

| | | |
|---|---|---|
| WO | WO 90/13138 | 11/1990 |
| WO | WO 03/049163 | 6/2003 |
| WO | WO 2006/064282 A2 | 6/2006 |

OTHER PUBLICATIONS

Pawlak, et al., Evidence on the mechanism of boron deactivation in Ge-preamorphized ultrashallow junctions; Applied Physics Letters, Mar. 22, 2004; vol. 84, No. 12, pp. 2055-2057, American Institute of Physics.

Nishikawa, et al., Elimination of secondary defects in preamorphized Si by C+ implantation; Applied Physics Letters, Jan. 18, 1993; vol. 62, No. 3; pp. 303-305, American Institute of Physics.

* cited by examiner

METHOD FOR JUNCTION FORMATION IN A SEMICONDUCTOR DEVICE AND THE SEMICONDUCTOR DEVICE MADE THEREOF

CROSS REFERENCE TO RELATED APPLICATIONS

This application claims priority under 35 U.S.C. §119(e) to U.S. provisional patent application 60/835,719 filed on Aug. 4, 2006, which application is hereby incorporated by reference in its entirety.

BACKGROUND OF THE INVENTION

1. Field of the Invention

The present invention generally relates to preparing a semiconductor substrate for device formation and more particularly to junction formation in a semiconductor device. More specifically, this invention relates to ultra shallow junction formation in a semiconductor device and the semiconductor device obtained with the method thereof.

2. Description of the Related Technology

Scaling down of semiconductor MOS devices has become a major challenge in the semiconductor industry. For sub-100 nm MOS devices, highly doped and ultra-shallow junctions are required for the suppression of short-channel effects and the improvement of parasitic resistance. For these ultra-shallow junctions the junction depth may be much smaller than 100 nm (e.g. 25 nm or less). More specifically box-shaped junction profiles with high active dopant concentration are preferred. However the fabrication of such box-shaped ultra-shallow junction profiles is not straightforward. Conventional techniques for junction formation are ion implantation followed by rapid thermal annealing (RTA) to electrically activate the dopant ions. However, the conventional methods are prone to so-called transient enhanced diffusion (TED). During the annealing step (e.g. RTA) the implanted dopant will show an enhanced diffusion due to the presence of excess Si interstitials. The effect of TED can be seen in a broadening of the dopant profile, which is of course disadvantageous for achieving box-shaped junction profiles.

To form an n-type implantation arsenic (As) is a very good candidate due to its abrupt and shallow junction profile. Phosphorus (P) however suffers a lot from this TED effect and the interstitials injected by high concentration P diffusion. To form a p-type implantation typically boron (B) is used. Also this dopant ion suffers a lot from the TED effect, which is especially pronounced in the low concentration region in the tail of the junction. In case of p-type doping there are no straightforward alternatives, like As versus P for n-type doping, which could be used to reduce this problem.

Surface pre-amorphization before dopant ion implantation is widely used to achieve ultra shallow junction profiles. However the main concern with pre-amorphization is the so-called end-of-range damage (EOR) located near the interface between amorphous and crystalline Si. This FOR results in secondary defects which may increase the junction leakage drastically. One way to eliminate these secondary effects is by introducing an additional implantation of carbon (C) after the dopant implantation (Appl. Phys. Lett. 62(3), 303 (1993)). It has also been shown that the C implantation performed after the dopant implantation can also eliminate the TED effect depending on the dose used for the carbon.

When this method of pre-amorphization, dopant implantation and carbon implantation is used in the integration process for MOS semiconductor devices, mainly the EOR forms a problem at the junctions (Appl. Phys. Lett. 84(12), 2055 (2004)).

In U.S. Pat. No. 6,680,250 a solution is proposed to space apart the FOR region from the junction region. After gate deposition, an amorphous region is formed to a depth which is significantly greater than the desired source/drain junction depth. The source/drain regions are implanted with dopant ions and followed by a laser thermal annealing to activate the dopants. Although with this solution the end-of-range defects are located far away from the junction position in the vertical direction, in the lateral direction end-of-range defects are still present in the channel region close to the lateral junction position.

US 2004/0235280 describes a method for forming a shallow Junction in a semiconductor substrate. The method comprises:

preamorphizing a first region of the semiconductor substrate to a first depth, implanting recrystallization inhibitors into a second region of the semiconductor substrate to a second depth, partially recrystallize the amorphized part of the substrate (first anneal), implanting dopants before or after partial recrystallization of the amorphized part of the substrate, and further recrystallize the amorphized part of the substrate (second anneal).

The first anneal creates end-of-range (EOR) dislocations at the interface between the amorphous and the crystalline material of the substrate. The first anneal only recrystallizes the part of the amorphous substrate that does not comprise recrystallization inhibitors. However, during the second annealing step in US 2004/0235280, EOR dislocations will be formed at the boundary between the recrystallized part and the remaining amorphized part of the substrate. Hence, EOR dislocations will still be present near source/drain regions.

SUMMARY OF CERTAIN INVENTIVE ASPECTS

One inventive aspect relates to a method of preparing a semiconductor substrate for forming a semiconductor device therein, comprising:

Providing a crystalline substrate amorphized to a first depth;

Implanting the top surface of the amorphized substrate with substitutional ions to a depth smaller than the first depth;

Annealing the amorphized substrate to recrystallize the substrate thereby substituting the substitutional ions at least partly into the substrate, and After recrystallization of the amorphized substrate, implanting the top surface with dopant ions, Annealing of the amorphized substrate is performed such that the amorphized substrate is completely recrystallized.

The substitutional ions may be carbon ions. Another inventive aspect relates to a method, which comprises:

providing a crystalline substrate amorphized to a first depth;

Implanting the top surface of the amorphized substrate with carbon ions to a depth smaller than the first depth;

Annealing the amorphized substrate to recrystallize the substrate, and

After recrystallization of the amorphized substrate, implanting the top surface with dopant ions, Annealing of the amorphized substrate is performed such that the amorphized substrate is completely recrystallized.

An advantage of this method is that it provides substitutional ions, e.g. substitutional carbon in a region having a smaller depth than EOR and therefor allows subsequent device formation remote from the EOR.

Optionally a patterned mask layer can be deposited before or after implanting with substitutional ions, e.g. carbon ions followed by removing the patterned mask layer after annealing the substrate. Mask layer deposition before the substitutional ions, e.g. carbon implantation reduces the amount of carbon underneath the mask layer.

Substitutional ions, e.g. substitutional carbon have the advantage of suppressing dopant extension.

The process of amorphizing may comprise implanting the substrate with a pre-amorphization ion dopant. This has the advantage that a separate deposition process such as an epitaxial deposition can be avoided.

The pre-amorphization ion dopant may be selected, e.g., from the group of $Si^+$, $Ge^+$, Xe, Ar. The pre-amorphization process may comprise implanting $Si^+$ at an energy approximately between 50 and 300 keV. The pre-amorphization process may comprise implanting $Ge^+$ at an energy approximately between 75 en 500 keV. These processes allow use of standard equipment to provide amorphizing of the substrate.

Preferably the first depth is deeper than about 100 nm. This has the advantage of pushing EOR well away from later formed junctions.

The substitutional ion, e.g. carbon ion implanting process may be done at an energy approximately in the range of 1 keV to 10 keV. The substitutional ions, e.g. carbon ion implanting process may be done with a dose approximately in the range of 1e14 at $cm^2$ to 1e15 at/$cm^2$. These processes allow a good concentration of substitutional ions, e.g. carbon atoms that can be at least partly substituted with silicon atoms of the semiconductor.

The annealing process may performed at a temperature approximately in the range of 700° C. to 1100° C. The annealing process may be performed for a time period approximately in the range of 1 s to 1000 s. These processes allow recrystallization of the substrate while not driving the dopant into deeper regions.

The dopant ions can be selected, e.g., from the group of B, BF3, In another BF2, B10H14, B18H22, P, PH3, As, Sb. This allows the formation of either n-type or p-type regions while still providing well defined shallow junctions.

Another inventive aspect also provides a semiconductor device obtainable by any of the methods described above, comprising:
end-or-range defects at a first depth,
substitutional ions, e.g. substitutional carbon at least in part of the top surface at a depth smaller than the first depth.

Such a semiconductor device may further comprise substitutional ions, e.g. substitutional carbon in source and drain region and/or in the channel region.

Another inventive aspect also provides semiconductor device comprising:
a semiconductor substrate having end-or-range defects at a first depth,
substitutional ions, e.g. substitutional carbon at least in part of the top surface at a second depth smaller than the first depth.

The semiconductor devices may further comprise active regions formed in the semiconductor substrate having a depth less than or equal to the second depth.

The present invention will now be described with reference to the following drawings.

BRIEF DESCRIPTION OF THE DRAWINGS

All drawings are intended to illustrate some aspects and embodiments of the present invention. The drawings described are only schematic and are non-limiting. In the drawings, the size of some of the elements may be exaggerated and not drawn on scale for illustrative purposes.

Exemplary embodiments are illustrated in referenced figures of the drawings. It is intended that the embodiments and figures disclosed herein should be considered illustrative rather than restrictive.

DETAILED DESCRIPTION OF CERTAIN ILLUSTRATIVE EMBODIMENTS

Figure 1:
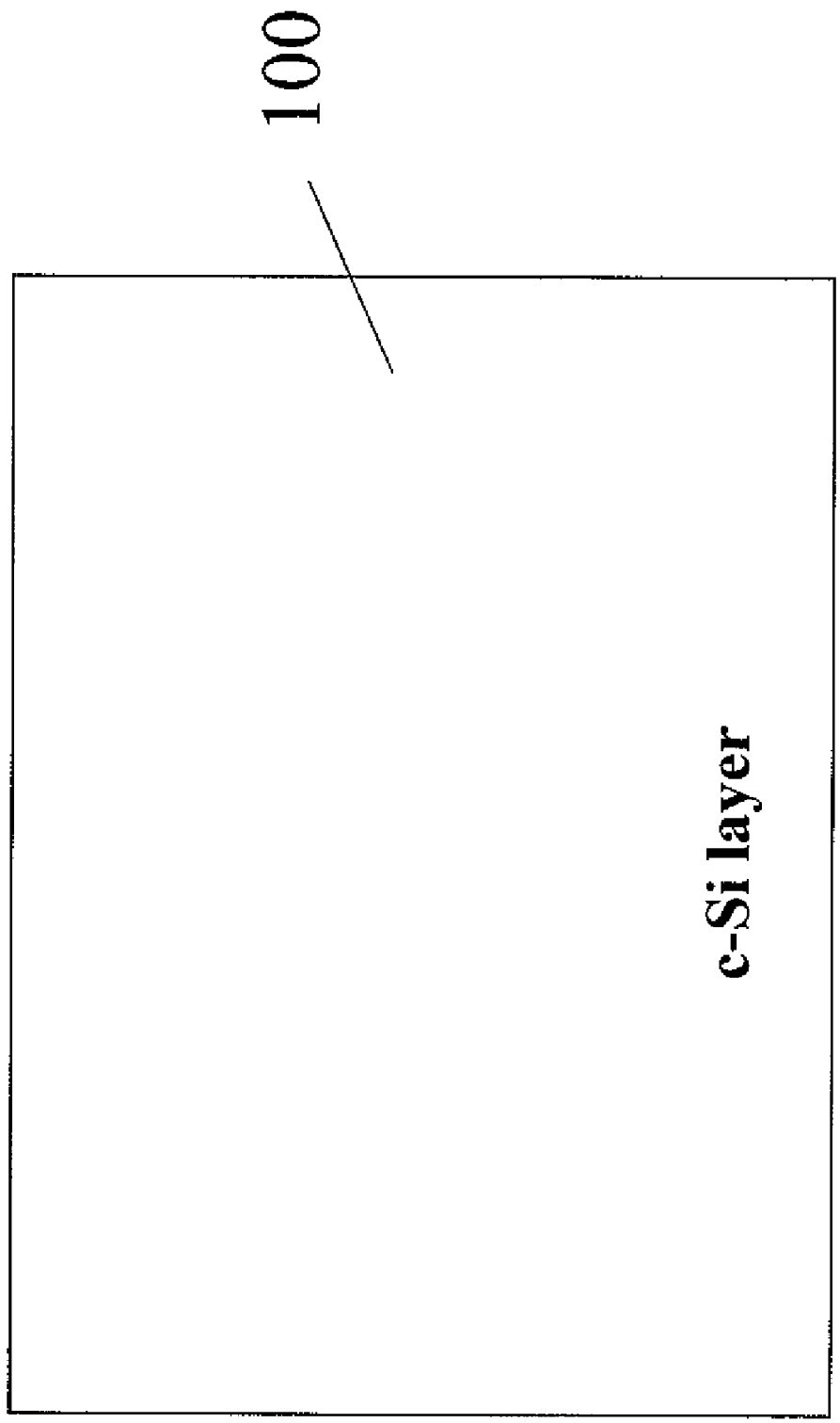
FIG. 1 is schematic representation of a crystalline semiconductor substrate for use with one embodiment.

One or more embodiments of the present invention will now be described in detail with reference to the attached figures, the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention. Those skilled in the art can recognize numerous variations and modifications of this invention that are encompassed by its scope. Accordingly, the description of preferred embodiments should not be deemed to limit the scope of the present invention.

Furthermore, the terms first, second and the like in the description and in the claims are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein. For example "underneath" and "above" an element indicates being located at opposite sides of this element.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

In the following certain embodiments will be described with reference devices structures such as field effect transistors having a drain source and gate but the embodiments are not limited thereto. For example the embodiments may be applied to heterojunction bipolar transistors (HBT). In the following the embodiments will also be described with reference to a silicon substrate but it should be understood that the embodiments apply equally well to other semiconductor substrates. In embodiments, the "substrate" may include a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer. The term "crystalline substrate" includes various forms of crystalline material such as monocrystalline or microcrystalline.

Certain embodiments are suitable for integration into CMOS processing to provide CMOS devices. In such processing active regions can be formed by doping a semiconductor layer. An active region is defined as any region which becomes active due to the implantation of a dopant such as As, B, Ph, Sb, etc. In an MOS device this active region is often referred to as source and/or drain region. However the invention is not limited thereto.

Certain embodiments as will be described below reduce the negative impact of the presence of the end-of-range (EOR) region near the desired source/drain junction depth in a semiconductor device. Certain embodiments have the end-of-range (EOR) region far away from the desired source/drain junction depth while also overcoming the disadvantages of transient enhanced diffusion (TED) to thereby obtain ultra shallow box-shape junction profiles.

Figure 4:
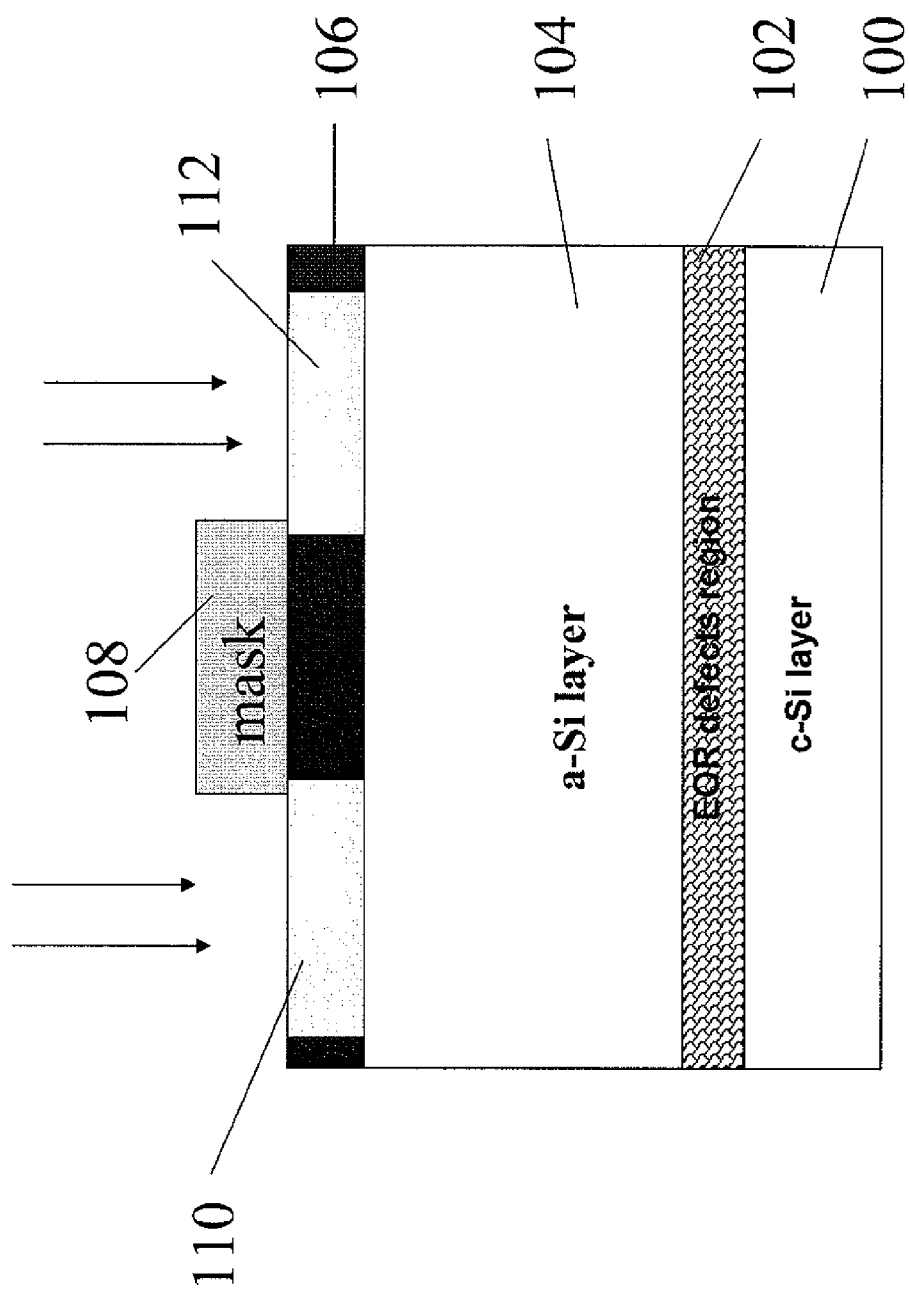

One embodiment provides a method of preparing a crystalline semiconductor substrate of semiconductor material ready for forming a device therein. A method according to one embodiment comprises the process of providing a crystalline semiconductor substrate amorphized to a first depth. The first depth can be defined, e.g., by the amorphizing parameters, such as implant energies and implant dose, e.g. of Si or Ge. This depth should be so deep that there is little or no interaction with the junctions formed later (both extensions and also very important deep source and drain junctions). Depths up to or in excess of about 100 nm can be used, e.g. up to 1 micron. This substrate may be provided by implanting an amorphizing element into a crystalline semiconductor thereby creating end-of-range defects at the first depth. Other methods of forming an amorphous layer are included within the scope of the embodiments, e.g. depositing an amorphous layer. Optionally a mask may be applied, e.g. a patterned mask. The top surface of the amorphized substrate is then implanted with carbon to a second depth smaller than the first depth, and the amorphized substrate is annealed to recrystallize the substrate. For other semiconductors a suitable substitutional element may be selected, e.g. for a SiGe substrate also Carbon can be chosen as substitutional element. However, for other semiconductors, other suitable substitutional ion or element may be used in accordance with embodiments of the present invention. The second depth may be determined by any suitable method, e.g. by determining where the concentration of carbon is less than $1.e19$ at/cm$^3$. A concentration of $1e19$ at/cm$^3$ can be clearly seen on an SIMS plot of Carbon. The annealing process should be performed in such a way as to generate substitutional elements (i.e. recrystallization), e.g. substitutional carbon atoms, in the crystalline lattice structure of the semiconductor. Without being limited by theory the substitutional element or ion should be of the kind to expel interstitials in the semiconductor substrate. If a mask has been deposited then the carbon will not be found in at least the majority of the region below the mask. Below the edges of the mask some carbon may be present as shown in FIG. 4, due to underdiffusion or ion implantation scattering. Optionally a dopant implanting process may be performed before or after the annealing process.

One embodiment provides, in a further aspect, a method of forming a junction in a semiconductor device in a substrate of a crystalline semiconductor material comprising the processes of providing the crystalline semiconductor substrate amorphized to a first depth. The amorphized substrate may be provided by implanting an amorphizing element into the crystalline substrate thereby creating end-of-range defects at the first depth. Other methods of forming an amorphous layer are included within the scope of the embodiment, e.g. depositing an amorphous layer. Optionally a mask, e.g. a gate mask is deposited. The top surface of the amorphized substrate is then implanted with carbon to a depth smaller than the first depth. The top surface of the substrate is then implanted with dopant ions, e.g. to form active regions of a device followed by annealing the amorphized substrate to recrystallize the substrate. The annealing process should be performed in such a way as to generate substitutional elements, e.g. substitutional carbon atoms, in the crystalline lattice structure of the semiconductor. The annealing process is performed such that the amorphized substrate is completely recrystallized. Without being limited by theory the substitutional element should be of the kind to expel interstitials in the semiconductor substrate. The preparation of the substrate for dopants comprises a recrystallization process, which positions Carbon in substitutional sites. An advantage of this approach is that amorphization followed by C co-implant and annealing can result in a high substitutional C content, e.g. higher than thermal equilibrium. The mask can be removed. Further processes may then be carried out, e.g. deposition of other layers, e.g. formation of a gate oxide and gate electrode above the channel between the active regions.

In a further alternative embodiment of the present invention a first annealing process is carried out after the implanting process with carbon. After the annealing process (to recrystallize the silicon) a dopant is implanted and a further annealing process may then be carried out (to activate the dopants).

Without being limited by theory the implanting process of the dopant and any subsequent thermal processing may preferably be carried out so that the depth of the dopant in the substrate is limited by the depth of the implanted carbon in the substrate.

In a first process of an embodiment of the present invention a substrate 100 of semiconductor material is prepared (see FIG. 1). The semiconductor material is crystalline silicon (Si). The semiconductor material call be monocrystalline, or microcrystalline, for example. In a second process of the present invention the substrate is amorphized to a first depth.

Figure 2:
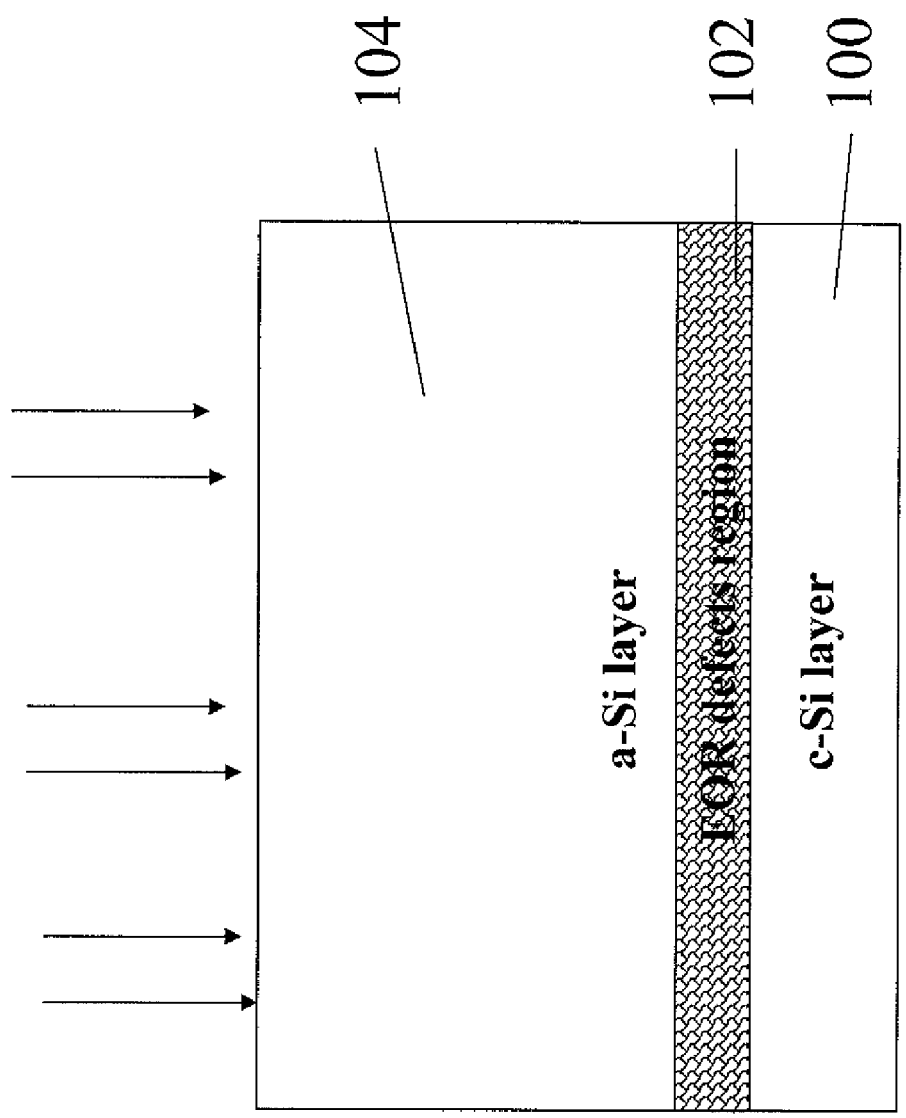
FIGS. 2 to 6 show the process in a manufacturing method according to an embodiment of the present invention.

This deep pre-amorphization can be done by any suitable method. One such preferred method is by implanting an amorphizing dopant, e.g. $Si^+$ or $Ge^+$ in the case of a silicon substrate, to form a layer 104 of amorphous semiconductor, e.g. amorphous silicon (a-Si) to a depth of 100 nm or greater (see FIG. 2). By doing a deep amorphization while forming only a shallow junction depth in subsequent processes, an end-of-range (EOR) region 102 will be located deep in the substrate and not in the neighborhood of the desired junction depth which is typically in the order of about 5 nm to 60 nm (60 nm is e.g. for deep source and drain junction), especially 5 to 30 nm, depending on the processing and application technology. The pre-amorphization process by implanting $Si^+$ is preferably done at an energy approximately in the range of 50-300 keV and with a dose approximately in the range of 1e15-2e15 $cm^{-2}$. The pre-amorphization process by implanting $Ge^+$ is preferably done at an energy approximately in the range of 75-500 keV and with a dose approximately in the range of 5e14-2e15 $cm^{-2}$.

In one embodiment, the pre-amorphization process is performed before the control electrode deposition, e.g. gate electrode deposition, during the manufacture of a three terminal device such as a transistor. In this way a much thicker layer of amorphous silicon can be formed compared to the method as presented in U.S. Pat. No. 6,680,250. The end-of-range defects are thus located much deeper in the substrate and are not located in the channel region or close to the junction region either vertically or horizontally within the device with respect to the channel region. The thickness of the amorphous silicon layer should be deeper than the desired junction depth. Depending on the processing and application technology the junction depth is approximately in the range of 5 nm and 60 nm. The thickness of the amorphous silicon layer may be at least 100 nm or deeper. Then the distance between junction and EOR is remote enough to avoid negative impact of crystal damage on transistor: dopant deactivation (poor thermal stability) and high junction leakage. By this way the EOR defects will not impact on the device performance. To form a thicker a-Si layer, e.g. 1 µm, higher implant energies can be used than those described above or described in the specific embodiments. Otherwise a 1 micron a-Si layer can be deposited on top of crystalline Si. Into this layer Carbon can be implanted. Afterwards Si substrate can be used as the seed for recrystallization.

Figure 7:
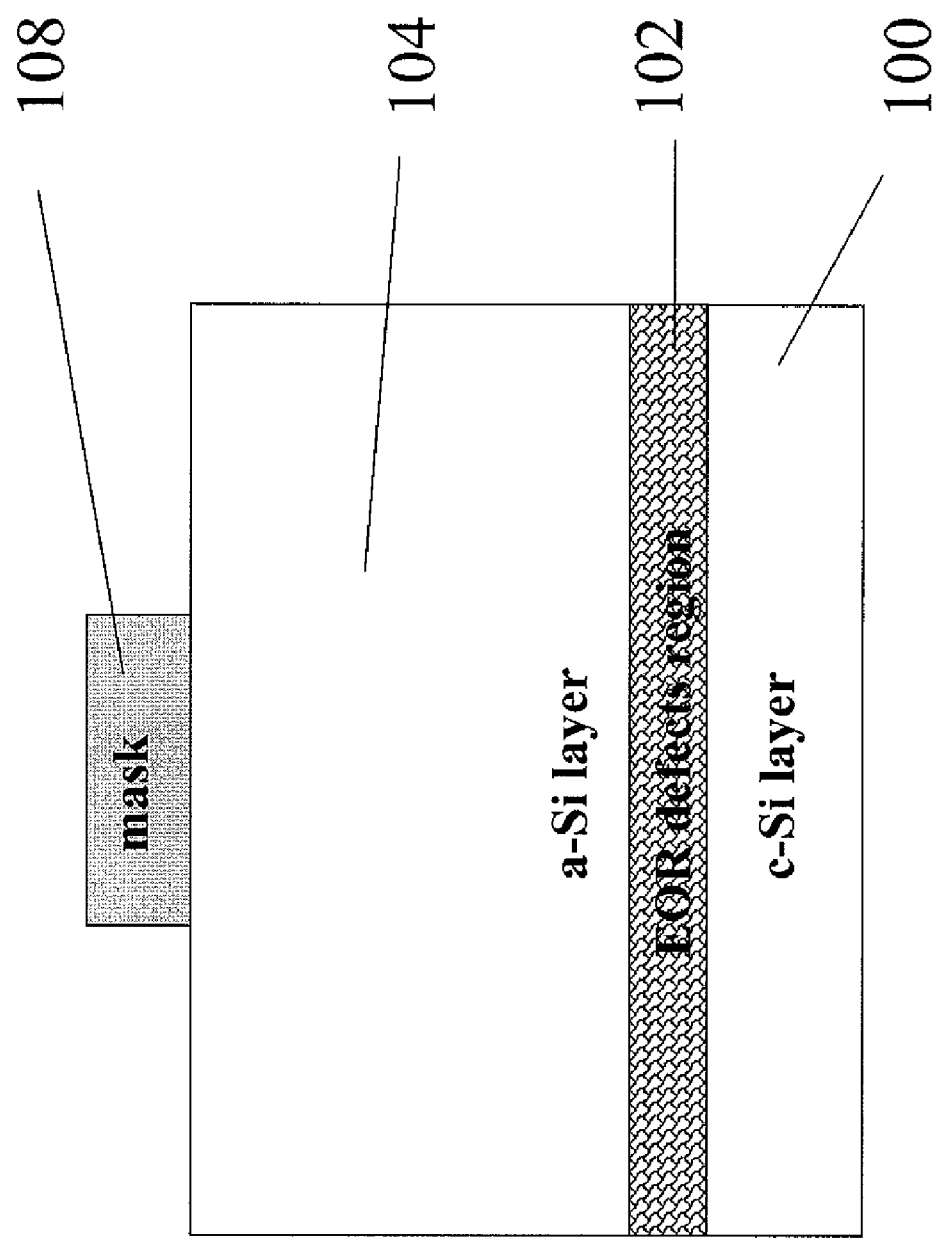
FIGS. 7 to 10 show the process in a manufacturing method according to an embodiment of the present invention subsequent to the process shown in FIGS. 1 and 2.

In a next process a mask 108 such as a control electrode mask may optionally be deposited (see FIG. 7). For example, a gate mask may be deposited on the substrate.

Figure 8:
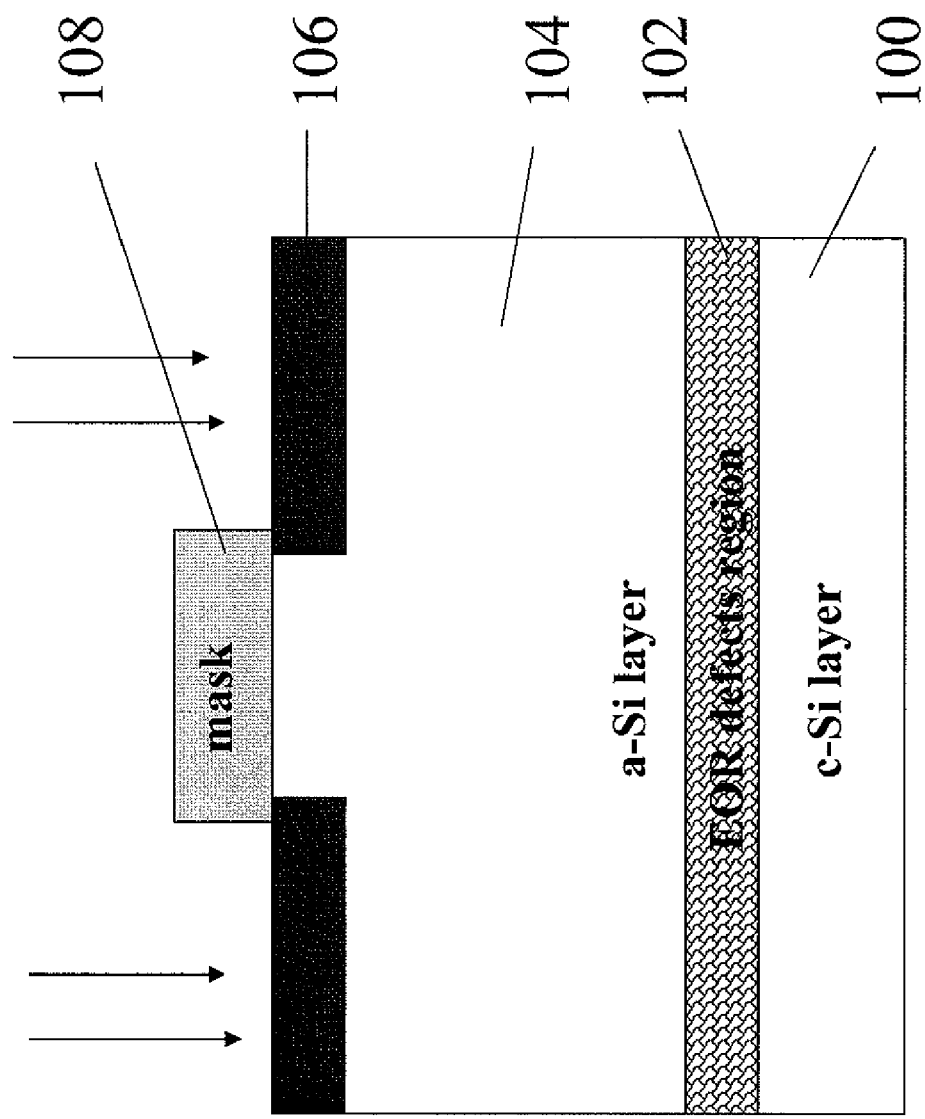

After the process of depositing the gate mask 108 the top surface of the amorphized substrate 104 is implanted with carbon ions to a second depth that is smaller than the first depth (see FIG. 8). In accordance with any of the embodiments of the present invention, the difference in depth between the first and second depths may be, e.g., at least 20 nm or more. Due to the gate mask deposited in the previous process, no carbon will be implanted in the region below the mask. Carbon will only be implanted in the neighboring regions 106 that will become the active regions, e.g. source/drain regions, in subsequent processes. Preferably the carbon ion implanting process is done at an energy in the range of about 1 keV to 10 keV and with a dose in the range of about 1e14 $at/cm^2$ to 1e15 $at/cm^2$ if the substrate is silicon. For example, the carbon is only implanted at the top surface of the substrate to a depth up to about 60 nm, e.g. in the range 5 to 50 nm.

Figure 3:
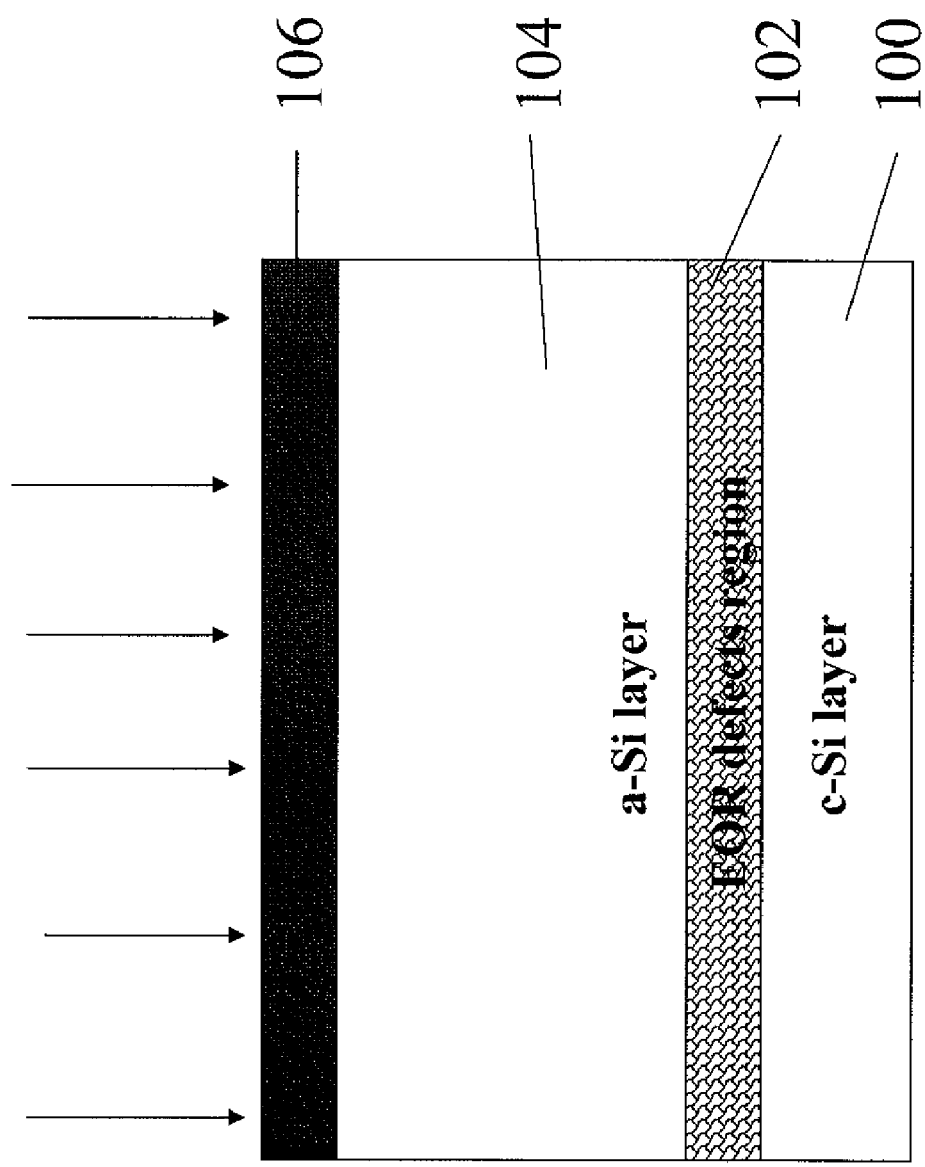

Alternatively the carbon implant can be performed before the gate mask deposition (see FIG. 3 layer 106). This means that carbon will also be implanted into a region of the substrate that becomes the channel region of a three terminal device such as a transistor in subsequent processing processes. This is one option for use with the devices of these embodiments since low energies are used for the carbon implantation and the carbon in the channel region will not influence the electrical behavior of the device significantly.

Figure 9:
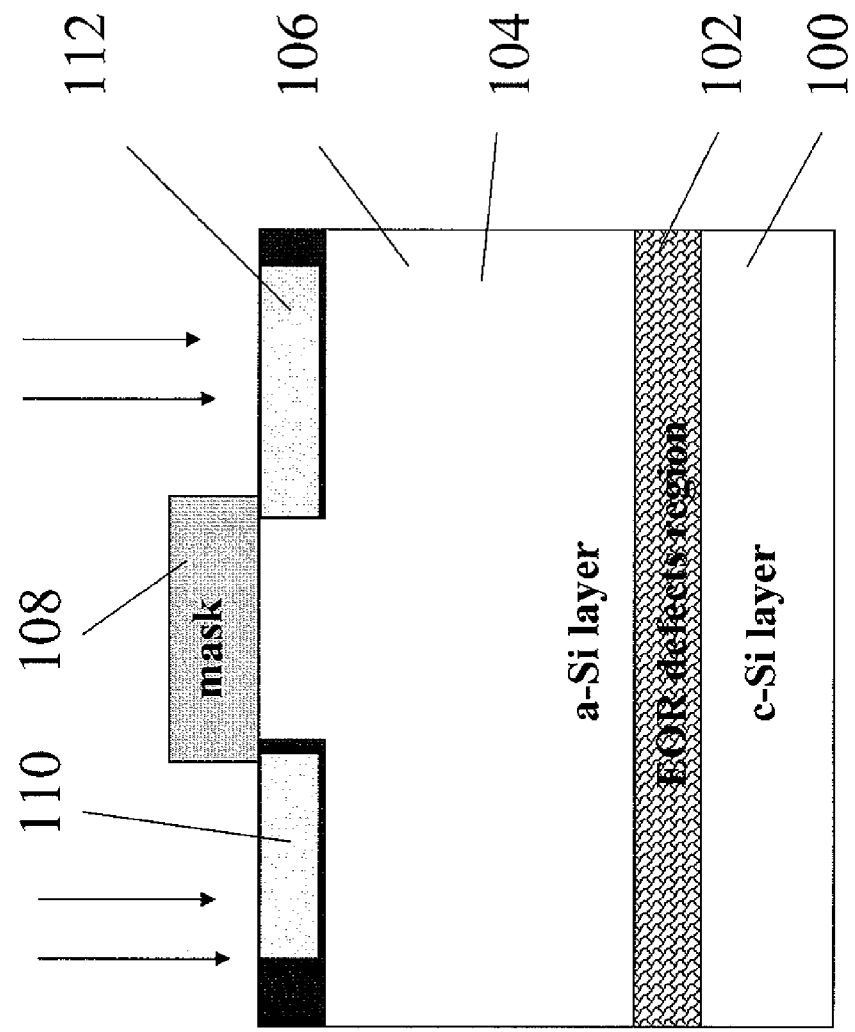

After the carbon implantation in the amorphous substrate, dopant ions are implanted, e.g. to dope the main electrode regions 110, 112 of a three terminal device (see FIGS. 4 and 9). For example the implantation can be to form source/drain regions of a transistor. These dopant ions can be n-type impurities (e.g. As, P) or p-type impurities (e.g. B). Any other suitable dopants may be used, e.g. selected from B, BF3, BF2, B10H14, B18H22, P, PH3, As, Sb, etc.

Figure 5:
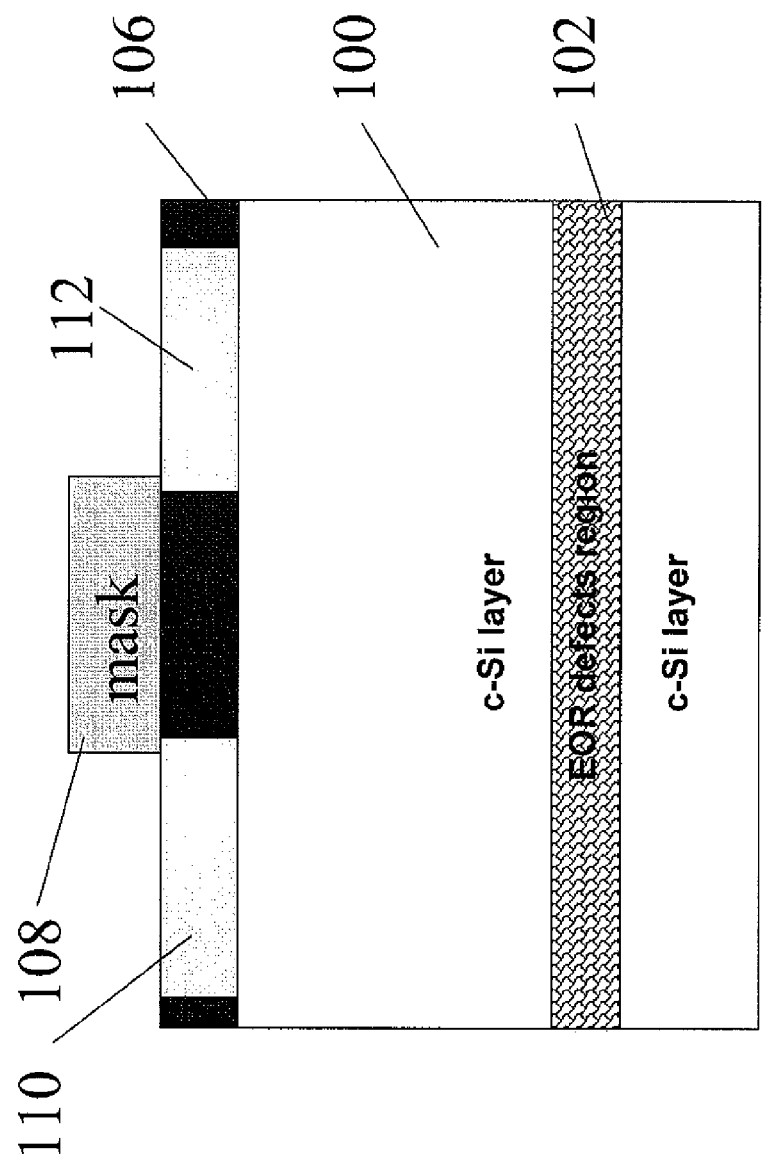
Figure 10:
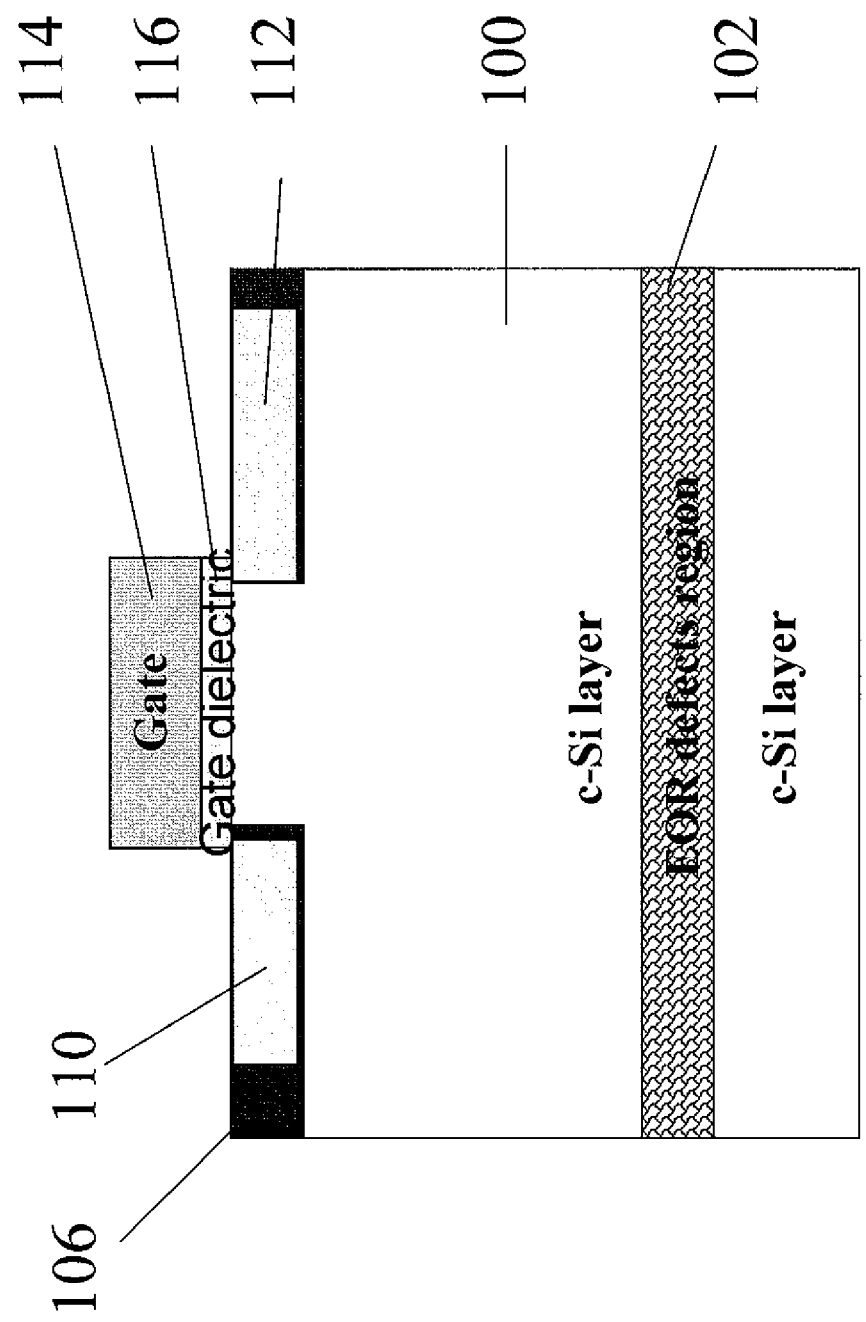

After the ion implantation, the amorphous substrate is recrystallized by performing an annealing process (see FIG. 5 and FIG. 10). The annealing process may be e.g. rapid thermal anneal (RTA). The thermal budget would be preferably around 1100 degrees Celsius for about 10 seconds. The temperature for annealing may be approximately in the range 700° C. to 1100° C., for example. The time for annealing may be in the range 1s to 1000 s, for example. The annealing process may preferably be controlled in terms of temperature and time so that the previously implanted carbon will become substitutional within a very shallow layer as measured from the top of the substrate, e.g. within a layer of 60 nm or less such as in the depth range of 5 to 50 nm. The annealing process may preferably be controlled in terms of temperature and time so that the amorphized substrate is completely recrystallized. From experiments it has been found that substitutional carbon will help in a good activation of the dopant ions to form a box-shape junction profile, i.e. to limit the diffusion of the implanted dopant in any subsequent annealing process. By substitutional carbon is meant that carbon atoms substitute themselves for silicon atoms in the crystal structure in a silicon substrate. The large difference between the covalent radii of carbon and silicon results in very large local strain when a carbon atom replaces one of the atoms in the host Si lattice.

Figure 6:
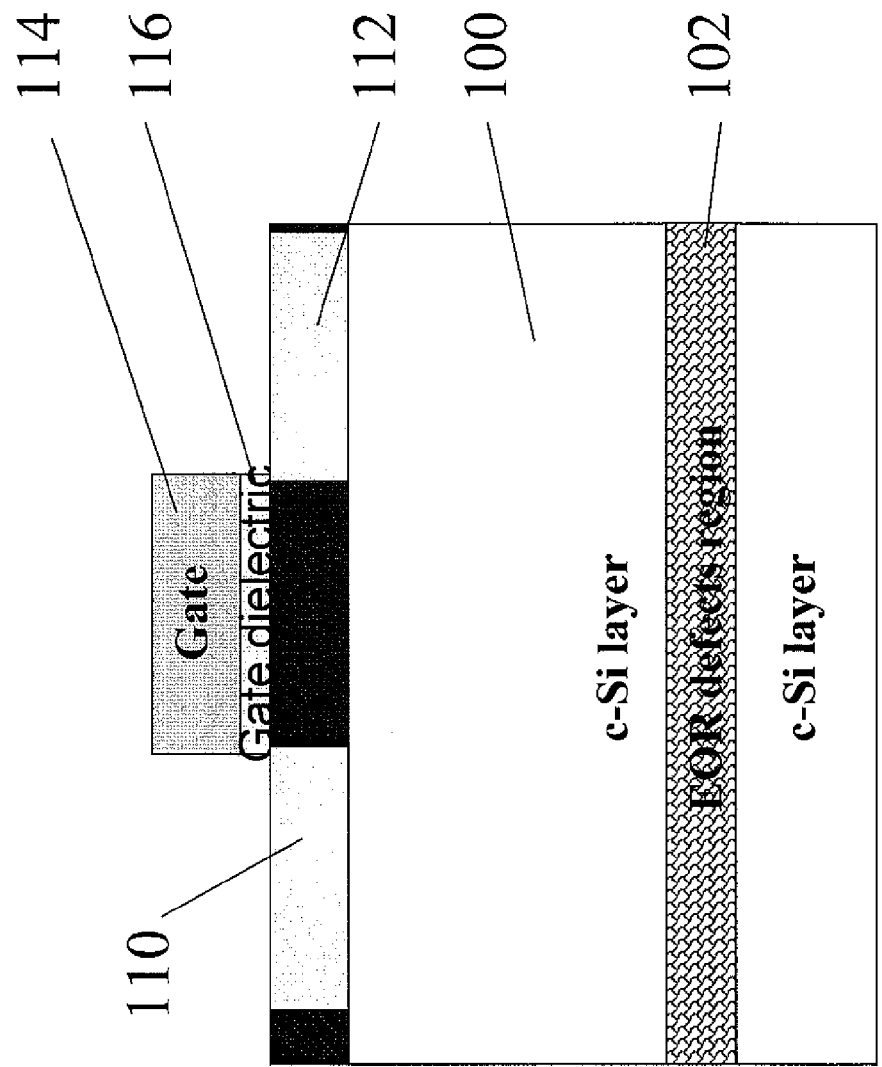

Additional processes may then be carried out to complete the device. For example any masks can be removed and a control electrode such as a gate electrode 114 and gate insulating layer 116 may be applied to form a three terminal device such as a Field Effect transistor with active regions 110, 112 and channel therebetween (see FIGS. 6 and 10).

Figure 11:
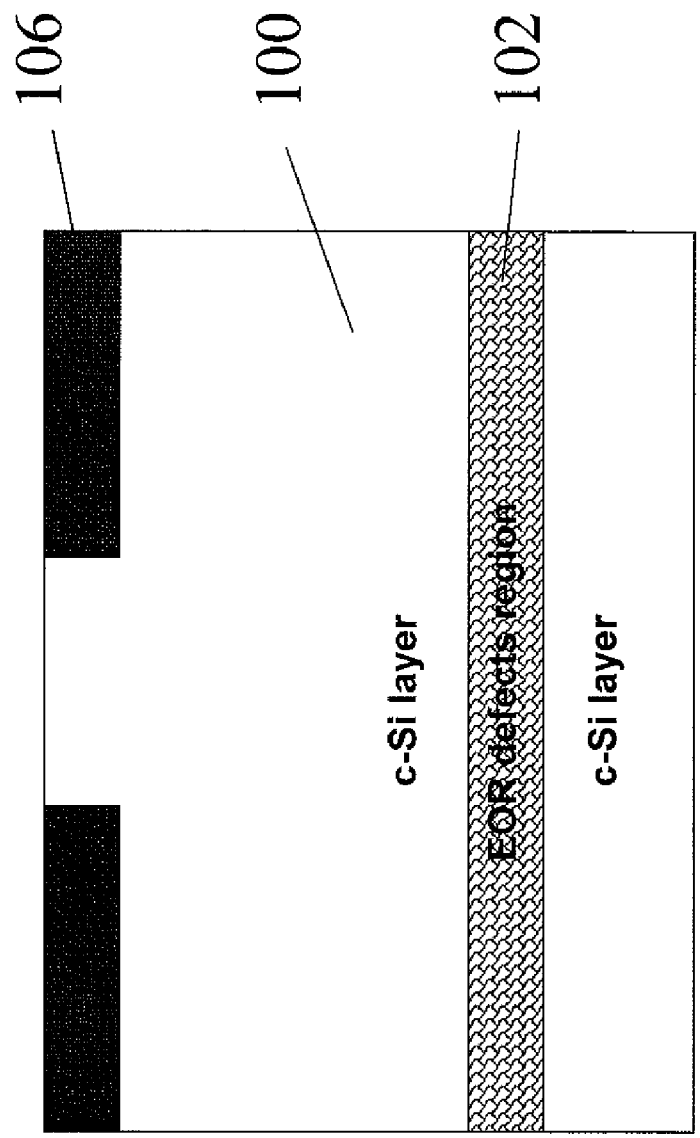
FIG. 11 shows an intermediate stage a processing flow in accordance with yet another embodiment of the present invention after processing in accordance with FIGS. 1, 2, 7, and 8 and an annealing process.

In an alternative embodiment of the present invention the annealing process is carried out after the carbon implanting process and before the dopant implanting process. Processes as shown in FIGS. 1, 2, 7 and 8 are first carried out followed by an annealing process to recrystallize the amorphous silicon. The result is as shown in FIG. 11 in which shallow carbon implanted regions 106 are formed in the surface of the annealed substrate 100 far away from the EOR 102.

As indicated above the method may also include any additional subsequent process such as the deposition of additional layers, implanting further dopants and/or cleaning by an etch or chemical-mechanical polishing of the wafer to improve the roughness if necessary.

Figure 12:
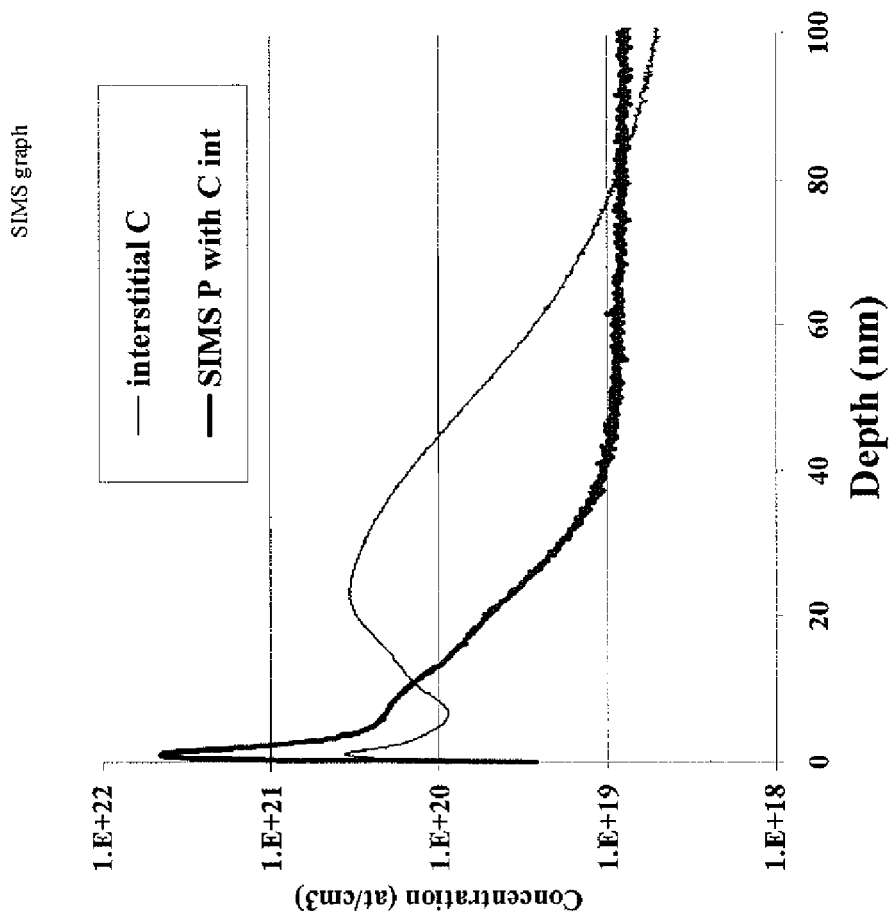
FIGS. 12 and 13 compare the effect on dopant migration in a silicon substrate after carbon implantation but no substitution (FIG. 12) and after implantation in accordance with the present invention (FIG. 13).
Figure 13:
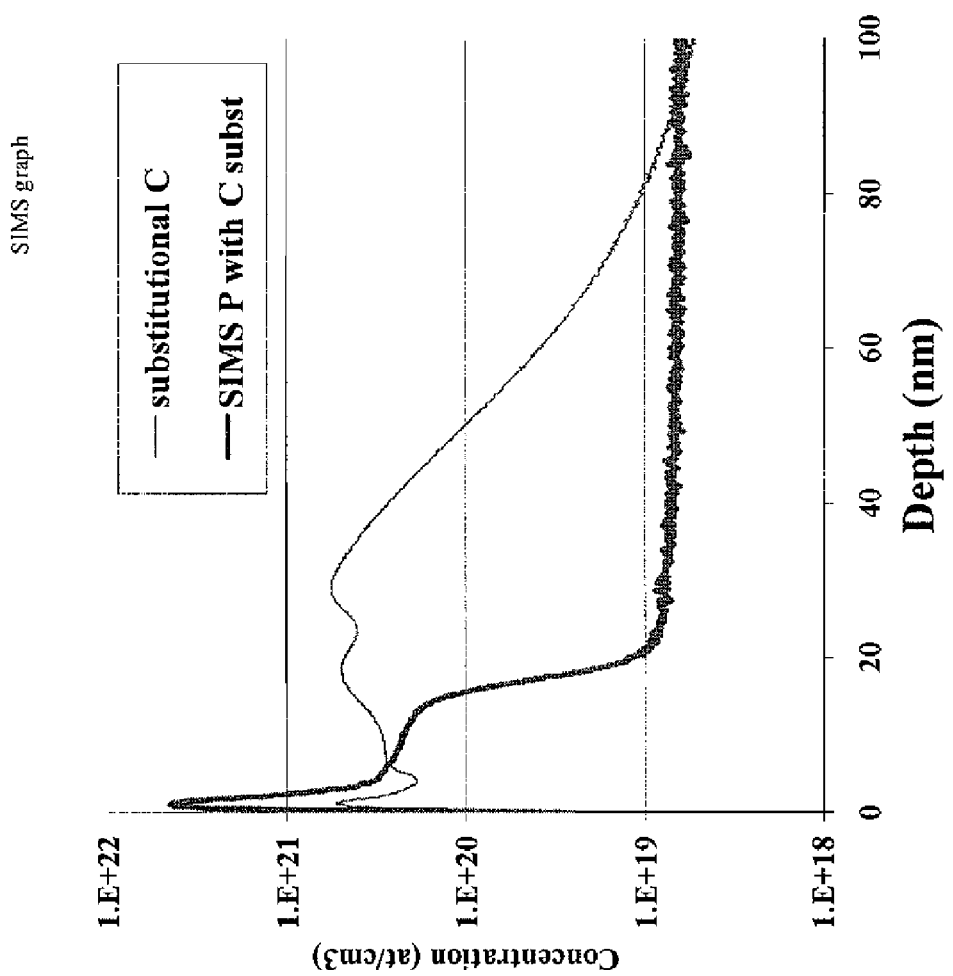

The exemplary effects of the foregoing embodiment are shown schematically in FIGS. 12 and 13. In FIG. 12 carbon is implanted into a silicon substrate but not in a substituted form. In this case the dopant process with phosphorus results in a long tail and the carbon has had no effect on restricting dopant extension. In FIG. 13 the carbon was substituted into the crystal lattice by performing a pre-amorphization process and subsequent annealing process and it can be seen that the phosphorus profile is shallow with an abrupt dopant reduction at a depth of about 20 nm. This is shallower than the carbon implantation indicating that the substitutional carbon suppresses dopant migration during annealing.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of preparing a semiconductor substrate for forming a semiconductor device therein, comprising:
   providing a crystalline substrate with its top surface amorphized to a first depth;
   implanting the top surface of the amorphized substrate with substitutional ions to a second depth smaller than the first depth;
   annealing the amorphized substrate to recrystallize the substrate thereby substituting the substitutional ions at least partly into the substrate, and
   after recrystallization of the amorphized substrate, implanting the top surface with dopant ions,
   wherein annealing the amorphized substrate is performed such that the amorphized substrate is completely recrystallized.

2. The method according to claim 1, wherein the substitutional ions are carbon ions.

3. The method according to claim 1, further comprising:
   depositing a patterned mask layer; and
   removing the patterned mask layer after annealing the substrate.

4. The method according to claim 1, wherein the providing of a substrate comprises:
   providing a crystalline substrate; and
   implanting the substrate with a pre-amorphization ion dopant.

5. The method according to claim 4, wherein the pre-amorphization ion dopant is selected from the group of $Si^+$, $Ge^+$, Xe, and Ar.

6. The method according to claim 5, wherein the implanting of the substrate comprises implanting $Si^+$ at an energy approximately between 50 and 300 keV.

7. The method according to claim 5, wherein implanting of the substrate comprises implanting $Ge^+$ at an energy approximately between 75 en 500 keV 8. The method according to claim 1, wherein the first depth is larger than 100 nm.

9. The method according to claim 1, wherein the substitutional ion implanting is performed at an energy in the approximate range of 1 keV to 10 keV.

10. The method according to claim 1, wherein the substitutional ion implanting is performed with a dose in the approximate range of 1e14 at/cm$^2$ to 1e15 at/cm$^2$.

11. The method according to claim 1, wherein the annealing is performed at a temperature in the approximate range of 700° C. to 1100° C.

12. The method according to claim 1, wherein the annealing is performed for a time period in the approximate range of 1 s to 1000 s.

13. The method according to claim 1, wherein the dopant ions are selected from the group of B, BF3, BF2, B10H14, B18H22, P, PH3, As, and Sb.

14. A semiconductor device manufactured by a process comprising the method of claim 1, the device comprising:
   end-of-range defects at a first depth from the top surface of a substrate; and
   substitutional ions at least in part of the top surface at a second depth substantially smaller than the first depth.

15. The semiconductor device according to claim 14, wherein the substitutional ions are carbon ions.

16. The semiconductor device according to claim 14, further comprising substitutional ions in source and drain regions.

17. The semiconductor device according to claim 15, further comprising substitutional ions in source and drain regions.

18. The semiconductor device according to claim 16, further comprising substitutional ions in a channel region.

19. The semiconductor device according to claim 17 further comprising substitutional ions in a channel region.

20. A method of manufacturing a semiconductor device, comprising:
   providing a crystalline substrate with its top surface amorphized to a first depth;
   implanting the top surface of the amorphized substrate with substitutional ions to a second depth substantially smaller than the first depth; and
   after the implanting with substitutional ions, annealing the amorphized substrate to recrystallize the substrate thereby substituting the substitutional ions at least partly into the substrate.

21. The method of claim 20, wherein the annealing is performed to recrystallize substantially the whole amorphized substrate.

22. The method of claim 20, further comprising implanting the top surface with dopant ions after the implanting with substitutional ions.

23. The method of claim 20, wherein the substitutional ions are carbon ions.

24. A semiconductor device manufactured by the method of claim 20.

25. A semiconductor device, comprising:
   end-of-range defects at a first depth from the top surface of a substrate; and
   substitutional ions at least in part of the top surface at a second depth from the top surface of the substrate, the second depth substantially smaller than the first depth.

* * * * *